(12) United States Patent
Eli et al.

(10) Patent No.: US 8,254,170 B2
(45) Date of Patent: Aug. 28, 2012

(54) PRELOADING DATA INTO A FLASH STORAGE DEVICE

(75) Inventors: Yigal Eli, Petach Tikva (IL); Mahmud Asfur, Bat Yam (IL); Shahar Bar-Or, Ra'Anana (IL)

(73) Assignee: Sandisk IL Ltd., Kfar Saba (IL)

( * ) Notice: Subject to any disclaimer, the term of this patent is extended or adjusted under 35 U.S.C. 154(b) by 323 days.

(21) Appl. No.: 12/664,631

(22) PCT Filed: Aug. 25, 2009

(86) PCT No.: PCT/IB2009/006632
§ 371 (c)(1),
(2), (4) Date: Dec. 14, 2009

(87) PCT Pub. No.: WO2011/024015
PCT Pub. Date: Mar. 3, 2011

(65) Prior Publication Data
US 2011/0228604 A1    Sep. 22, 2011

(51) Int. Cl.
*G11C 16/06* (2006.01)
(52) U.S. Cl. .................. 365/185.09; 365/200
(58) Field of Classification Search .......... 365/200, 365/185.09, 222
See application file for complete search history.

(56) References Cited

U.S. PATENT DOCUMENTS

| | | | |
|---|---|---|---|
| 5,657,332 A | 8/1997 | Auclair et al. | |
| 6,522,580 B2 | 2/2003 | Chen et al. | |
| 2001/0052092 A1 | 12/2001 | Matsushita | |
| 2005/0007801 A1 | 1/2005 | Barzilai et al. | |
| 2007/0211532 A1 | 9/2007 | Gonzalez et al. | |
| 2008/0263265 A1 | 10/2008 | Litsyn et al. | |
| 2008/0263266 A1 | 10/2008 | Sharon et al. | |
| 2009/0292972 A1* | 11/2009 | Seol et al. | 714/763 |

OTHER PUBLICATIONS

International Search Report and Written Opinion of the International Searching Authority for International Application PCT/IB2009/006632 dated Nov. 13, 2009, 14 pages.

* cited by examiner

*Primary Examiner* — Huan Hoang
(74) *Attorney, Agent, or Firm* — Toler Law Group, PC

(57) ABSTRACT

Programmer's data is initially stored in a memory device of the storage device by using an MBC storage scheme. After the storage device is embedded in a host device, the programmer's data is internally read from the memory device by using conventional read reference voltages, and the number of erroneous data bits in the programmer's data is calculated. If the programmer's data includes an uncorrectable number of erroneous data bits, the programmer's data is iteratively reread by using unconventional read reference voltages with decreased levels. The iteration process, which includes decreasing the level of the read reference voltages and recalculating the number of erroneous data bits, is terminated when the number of erroneous data bits in the programmer's is less than or equals a predetermined number of erroneous data bits, after which the storage device restores the programmer's data and conventionally rewrites it into the memory device.

16 Claims, 8 Drawing Sheets

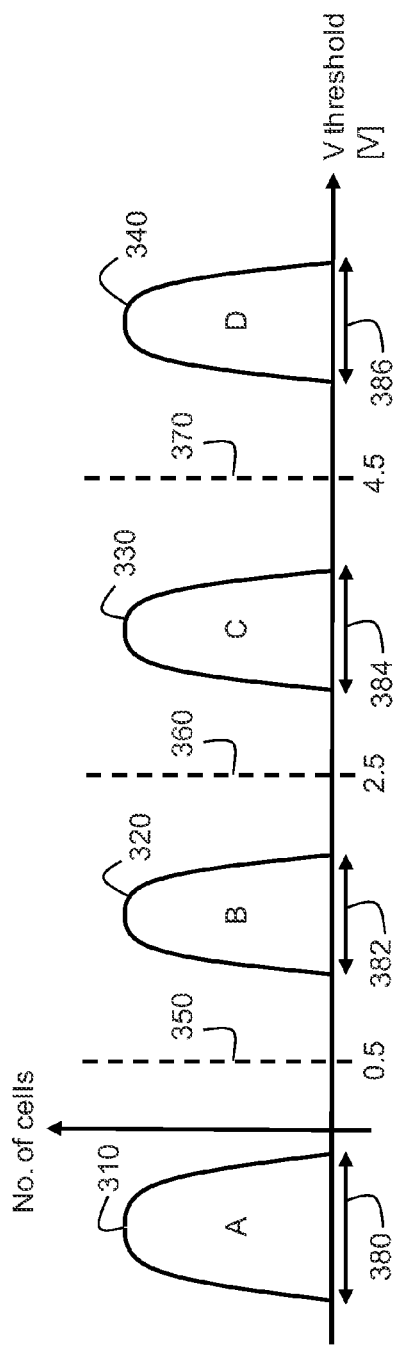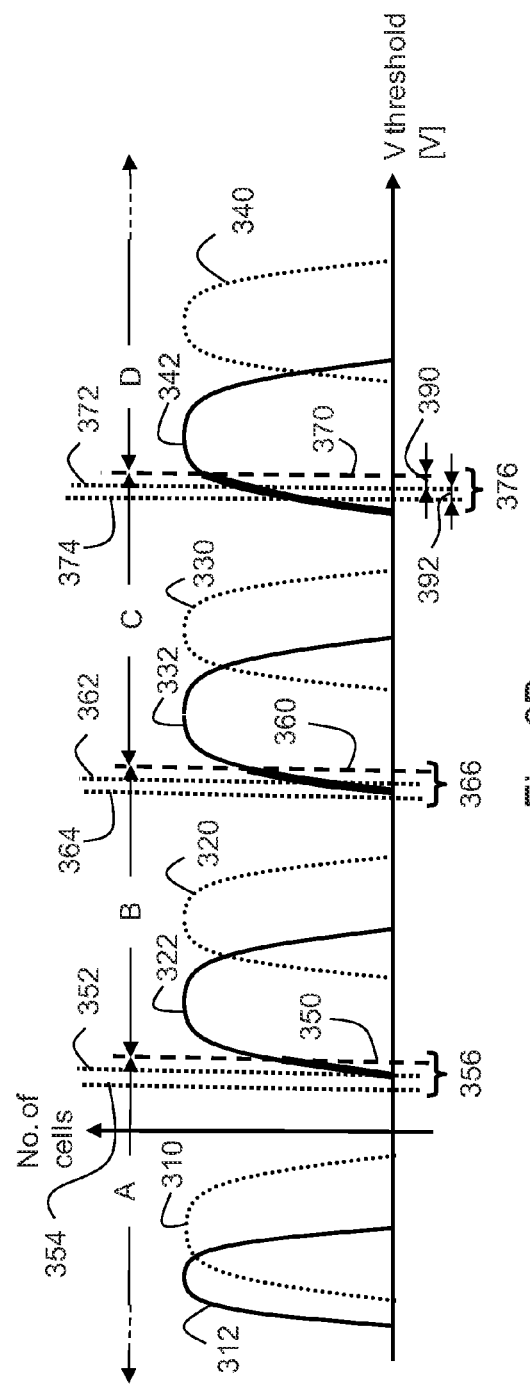

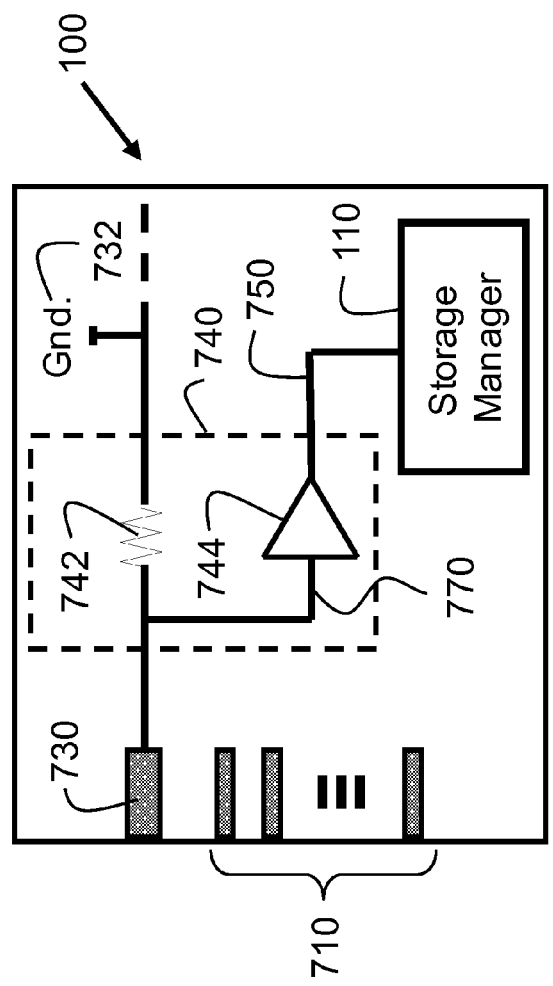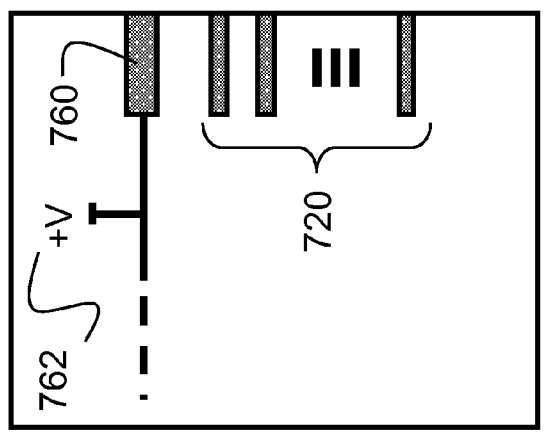
FIG. 7

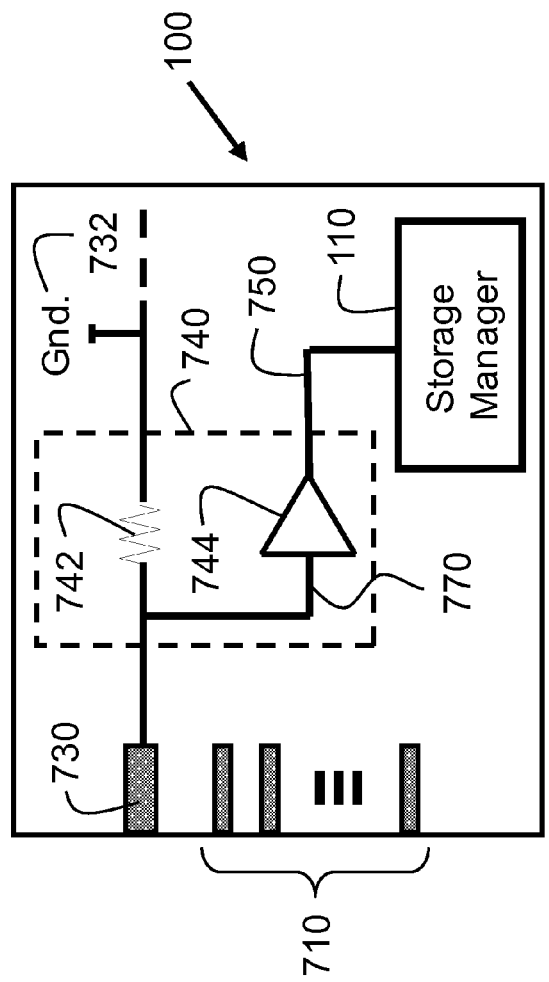
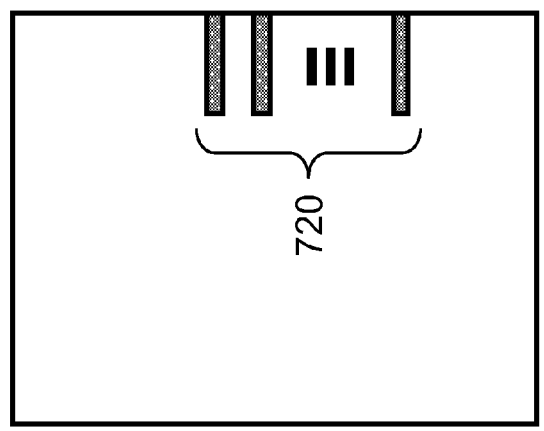
FIG. 8

PRELOADING DATA INTO A FLASH STORAGE DEVICE

RELATED APPLICATION

This application claims priority under 35 U.S.C. 119(a) and 365(b) to International Application Number PCT/IB2009/006632, filed Aug. 25, 2009, which is expressly incorporated herein by reference in its entirety.

FIELD OF THE INVENTION

The present invention generally relates to flash storage devices and more specifically to a method for preloading data to a flash storage device and to a storage device that uses the method.

BACKGROUND

Use of flash storage devices has been rapidly increasing over the years because they are portable and they have small physical size and large storage capacity. Flash storage devices come in a variety of designs. Some storage devices are regarded as "removable" which means that a user can move them from one host device to another or replace one storage device with another. Other storage devices are regarded as "embedded" which means that they cannot be and are not intended to be removed by the user from a host device with which they operate. For various reasons, manufacturers of embedded storage devices preload user data into storage devices before they are incorporated into the hosts. In general, user data is preloaded into the storage device before a host is distributed to an end user with the storage device embedded in it. Global Positioning System ("GPS") maps, music files, video files, video games, and the like, are examples of user data.

Memory cells that are operated as Single-Bit per Cell ("SBC") cells are known for having higher data-retention durability than memory cells that are operated as Multi-Bit per Cell ("MBC") cells. However, user data is traditionally stored in memory cells that are operated as MBC cells because user data are typically large (e.g., in the order of hundreds of megabytes to gigabytes), and storing them compactly in MBC cells saves storage space.

Typically, a storage device is embedded in a host device by using a reflow soldering process. MBC cells with the preloaded user data are susceptible to possible effects of the heat generated from the reflow soldering process and the data in them may be altered as a result, particularly because of the relatively small error margins that exist between the different binary states of the memory cells (e.g., smaller error margins then those between binary states in SBC cells). In other words, excess heat that is generated as a result of the reflow process decreases the threshold voltages of the memory cells, thus causing them to unintentionally transition from designated binary states to other (i.e., erroneous) binary states.

There is therefore a need to address the problem of reflow-induced discharge of electric charge in memory cells when the involved storage device is embedded in a host device.

SUMMARY

Therefore, it would be beneficial to be able to restore user data in a storage device after the reflow process is completed, even though the user data is preloaded to the storage device before the reflow phase. It would also be beneficial to store the user data in MBC cells before the reflow phase and after the storage device is embedded in a host device. Various embodiments are designed to implement such data restoration, examples of which are provided herein.

To address the foregoing, programmer's data, which is transferred from a programming device to a storage device, is initially stored in a memory device of the storage device by using a conventional MBC storage scheme. After the storage device is embedded in a host device, the programmer's data is internally (i.e., in the storage device) read from the memory device by using conventional read reference voltages, and erroneous data bits in the programmer's data are detected and their number $E_A$ is calculated. If the programmer's data includes erroneous data bits that cannot be corrected by the storage device, the programmer's data is iteratively reread by using unconventional read reference voltages, where, in each iteration, the level of the unconventional read reference voltages is lowered further according to a predefined scheme.

The iteration steps of (1) lowering the levels of the read reference voltages, (2) (re)reading the programmer's data by using the lowered read reference voltages, and (3) (re)calculating the number of erroneous data bits, $E_A$, in the programmer's data, are reiterated until (i.e., terminated when) the number of erroneous data bits, $E_A$, in the programmer's is less than or equals a predetermined number of erroneous data bits, $E_T$, that can be corrected by the storage device.

After the iteration process is terminated, the storage device restores the programmer's data and rewrites the restored programmer's data into the memory device by using the same, or more compact, MBC storage scheme in a conventional way.

BRIEF DESCRIPTION OF THE DRAWINGS

Various exemplary embodiments are illustrated in the accompanying figures with the intent that these examples not be restrictive. It will be appreciated that for simplicity and clarity of the illustration, elements shown in the figures referenced below are not necessarily drawn to scale. Also, where considered appropriate, reference numerals may be repeated among the figures to indicate like, corresponding or analogous elements. Of the accompanying figures:

FIG. 3A shows an example conventional MBC storage scheme for preloading programmer's data into a storage device before the storage device is embedded in a host device;

FIG. 3B illustrates unconventional read reference voltages that can be used to read programmer's data according to an example embodiment;

FIG. 7 shows an electrical terminal and circuit for generating a connectivity signal for a storage manager according to an example embodiment; and FIG. 8 shows the storage device of FIG. 7 and a conventional host device.

DETAILED DESCRIPTION

Figure 1:
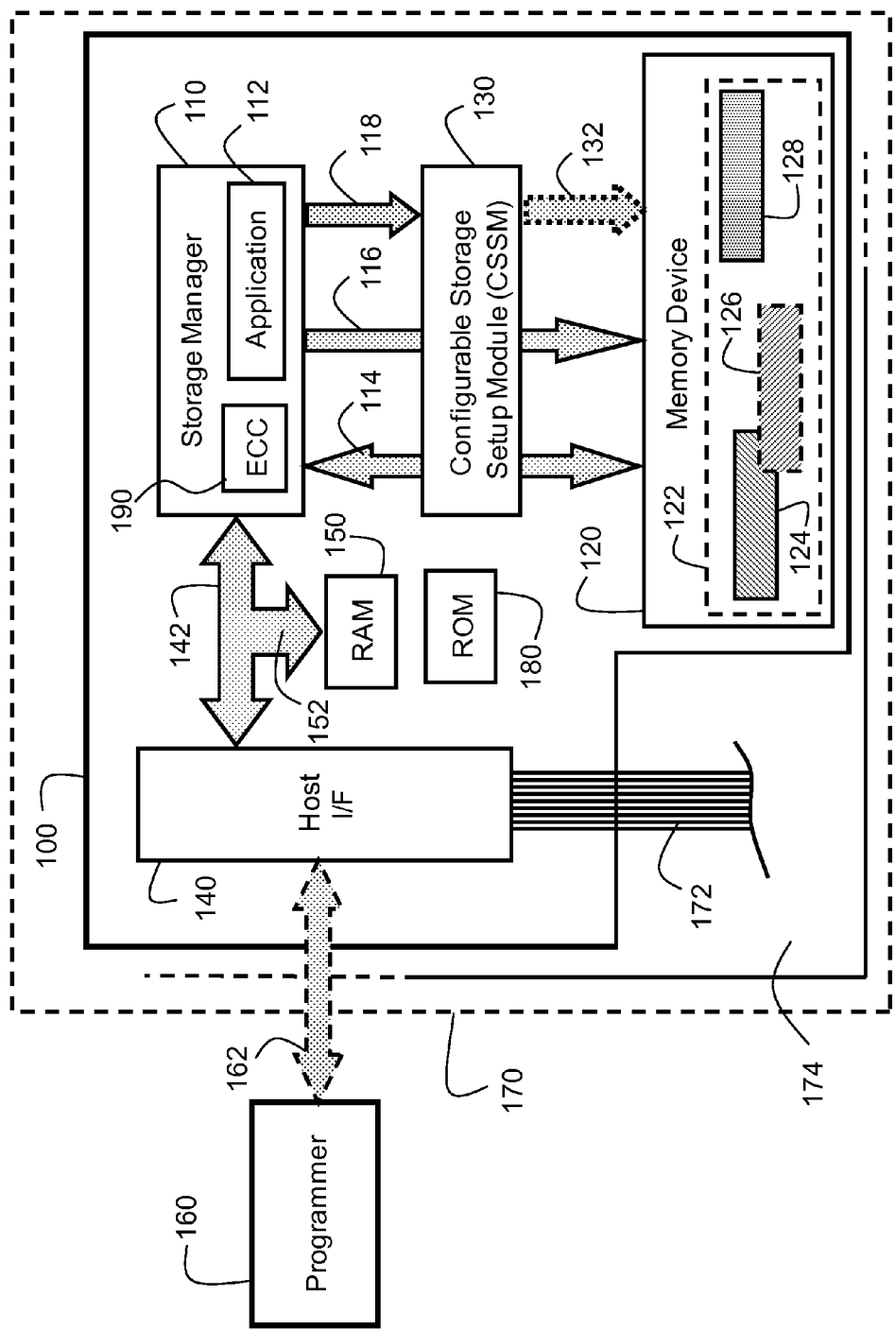
FIG. 1 is a block diagram of a storage device according to an example embodiment.

The description that follows provides various details of exemplary embodiments. However, this description is not intended to limit the scope of the claims but instead to explain various principles of the invention and the manner of practicing it.

The terms "conventional location of a threshold voltage distribution curve on a threshold voltage axis", "conventional threshold voltage (distribution) range", "conventional threshold voltage distribution curve", and "conventional read reference voltage", refer to data storage instances that are commonly accepted by the flash memory industry as optimized for operating flash memory cells. "Operating a (flash) memory cell" means performing various storage and storage-related operations on the (flash) memory cell, such as writing data into and reading data from the (flash) memory cell. With respect to the "cells count vs. cells' threshold voltage levels" graph (which is shown, as an example, in FIG. 3A), the conventional level of the memory cells' threshold voltages (i.e., the locations of the memory cells' threshold voltages on the voltage axis on the voltage axis of the graph) depends on the type of storage device (e.g., 2 bit-per-cell based device, 3 bit-per-cell based device, etc.), the involved technology (e.g., NAND, NOR), and the specifics of the related storage process. That is, the locations of the conventional threshold voltage distribution curves and their related conventional threshold voltage ranges are predetermined such that data writing and data reading are optimized in terms of reliability and performance. Accordingly, the locations of the conventional threshold voltage distribution curves, and their related conventional threshold voltage ranges, pertaining to one type of storage device (e.g., 2 bit-per-cell based device) may differ from the locations of the conventional threshold voltage distribution curves, and their related conventional threshold voltage ranges, pertaining to another type of storage device (i.e., 3 bit-per-cell based device).

Flash memory cells, which are the storage elements of a storage device, are typically implemented as floating gate transistors. The floating gate of a memory cell is capable of retaining a maximum amount of electric charge that is limited by the physical dimensions of the floating gate. Different amounts of electric charge of a memory cell are interpreted as different binary states, where a binary state of a memory cell corresponds to the data stored in it (e.g., "00", "01", etc.). The electric charge of a memory cell, and therefore its binary state and data, is detectable by detecting the threshold voltage of the memory cell. Saying that a memory cell is, for example, in binary state "0" (in which case the cell stores one data bit), in binary state "11" (in which case the cell stores two data bits), or in binary state "101" (in which case the cell stores three data bits) and saying that the memory cell respectively stores the binary data "0", "11", or "101" are deemed equivalent. The number of bits of data (e.g., 1, 2, 3, etc.) a memory cell stores depends on the storage setup, or storage scheme, used to operate the memory cell.

Briefly, "reflow soldering" (or "reflow", for short) is a soldering process in which the circuit board assembly is heated in order to solder the components' electric terminals to the corresponding pads on the circuit board. While the storage device is soldered to the host's circuit board, the high soldering temperature, which is typically within the range of 175° C. to 270° C., causes memory cells to lose electric charge. When a memory cell loses a significant amount of electric charge, a threshold voltage of the cell may change and, as a result, the binary state of the cell may change, thus altering the data stored in the cell. Such data change is, of course, undesired.

One solution to the problem posed by the reflow process involves preloading the user data to an SBC storage device. This solution may be acceptable by the users using the host device, whether it is a digital camera, a cellular phone, etc., but it is problematic from the host devices manufacturers' point of view because they need to separately handle (assemble, test, operate, etc.) several storage devices. In addition, dedicating an SBC storage device for storing user data consumes real-estate in the host device (e.g., physical space on the device's circuit board), and a controller of the storage device has to manage (e.g., address, communicate with, etc.) the SBC device separately, which is inefficient.

Another solution involves storing the user data in MBC cells and performing a process known in the field of flash memory devices as a "healing process". During the healing process, the heat-induced discharge of the electric charge of a memory cell is mitigated by controlling the temperature baking profile of the storage device. However, using a healing process has a drawback: the smaller are the memory cells of a storage device, the less is its efficiency. Namely, the healing process may work for 70 nanometers (nm) technology, but it is less efficient for 56 nm and lesser efficient for 34 nm, etc.

FIG. 1 is a block diagram of a storage device 100 according to an example embodiment. Storage device 100 includes a storage manager 110; a memory device 120 that includes a plurality of charge-storing memory cells 122 that may be, for example, NAND flash memory cells. Each of memory cells 122 holds K (K≧2) bits of data, or K data bits, and is programmable into one of $2^K$ binary states, where each of the $2^K$ binary states is represented by a particular one of $2^K$ threshold voltage ranges and readable by using $2^K-1$ read reference voltages.

Storage device 100 also includes a configurable storage setup module ("CSSM") 130 that is configurable by storage manager 110 to enable storage device 100 to operate memory cells of memory cells 122 as MBC cells conventionally when storage device 100 is connected to a programming device, and unconventionally after storage device 100 is embedded in a host device, as described below. Storage device 100 also includes a host interface (i.e., host I/F 140) to facilitate bi-directional communication between storage manager 110 and a programming device or a host device.

By way of example, storage device 100 is shown embedded into, and connected via control and data bus 172 to, a host 170. For technical and other reasons, before storage device 100 is embedded into host 170, storage device 100 is datawise initialized by its manufacturer by preloading data into memory device 120. Although storage device 100 is shown in FIG. 1 connected to a programmer 160 (an exemplary programming device) and embedded in host 170 (an exemplary host device), in reality this is not the case. Namely, before storage device 100 is embedded in host 170, storage device 100 is connected first to programmer 160 in order to preload the initial data to memory device 120 via command and data bus 162. The initial data transferred from programmer 160 to storage device is also referred to herein as "programmer's data". The programmer's data preloaded to memory device 120 by programmer 160 may be or include, for example, GPS maps, music files, video files, games' files, and other types of data. In other words, although both programmer 160 and host 170 are shown connected to host I/F 140, each device is connected to it at a different time: programmer 160 is connected to it in order to preload the programmer's data to memory device 120, and host 170 is connected to it physically when host 170 is assembled, and also operationally when host 170 is electrically switched "on". Command and data bus 162 has a connector that is removably connectable to a programming socket of storage device 100. The storage device's programming socket and the connector of command and data bus 162 are not shown in FIG. 1.

During programming of storage device 100 by programmer 160, the connector of command and data bus 162 is connected to the storage device's programming socket, and during assembly of host 170, control and data bus 172 is wired to host I/F 140. Control and data bus 172 may be a flat cable or circuit board conductors. During the assembly of host 170 by the host's manufacturer or assembler, storage device 100 is soldered to a circuit board 174 of host 170. After the assembly process of host 170 is completed and host 170 is powered up, storage device 100 and host 170 can interoperate in a conventional way.

Storage manager 110 is coupled 142 to host I/F 140 and exchanges, there through, data/information, status information, and commands with external devices such as programmer 160 and host 170. Storage manager 110 also manages storage operations that include, or that are associated with, writing data into and reading and erasing data from memory device 120. CSSM 130 is operatively coupled 132 to memory device 120, and storage manager 110 manages the way data is written into and read from memory cells 122 by controlling the operation of CSSM 130, as explained below in more detail, for example, in connection with FIG. 2.

Storage manager 110 transfers data to or receives data from memory device 120 over data bus 114; transfers addresses of memory cells to memory device 120 via address bus 116, and transfers control signals to CSSM 130 via control bus 118 to facilitate the conventional and unconventional storage operations. For example, if storage manager 110 is requested; e.g., by programmer 160 or by host 170, to write data into particular memory cells within memory device 120, storage manager 110 forwards the data to memory device 120 with the pertinent address of the particular memory cells and with control signals that facilitate writing the data into the correct memory cells. Likewise, if storage manager 110 is requested to read data from particular memory cells within memory device 120, storage manager 110 forwards an address of the particular memory cells to memory device 120 with control signals that facilitate reading the data from the correct memory cells.

CSSM 130 is configurable by storage manager 110 in a sense that storage manager 110 can configure and use it to operate memory cells within memory device 120 as MBC cells conventionally, by using a set of conventional threshold voltage distribution and conventional read reference voltages, or unconventionally, by using unconventional (i.e., adjusted) one or more read reference voltages. By "storage setup" is meant herein a configuration of CSSM 130 that enables storage manager 110 to operate memory cells 122, or a selected part thereof (e.g., cells' group 124), as conventional MBC cells or as unconventional MBC cells. A first configuration of CSSM 130 pertains to, or is defined by, a set of $2^K$ conventional threshold voltage ranges and a set of $2^K-1$ conventional read reference voltages. A second configuration of CSSM 130 pertains to, or is defined by, a set of $2^K-1$ unconventional read reference voltages.

In general, the first configuration of CSSM 130 is used to preload programmer's data in storage device 100 conventionally, and also to rewrite the programmer's data in storage device 100 conventionally after the programmer's data is restored after it is corrupted by the reflow process, and the second configuration of CSSM 130 is used to read the corrupted programmer's data with a correctable number of erroneous data bits. Regarding the second configuration of CSSM 130, applying "unconventional read reference voltages" means that storage manager 110 iteratively stepwise (re)adjusts (i.e., lowers) the voltage levels of the read reference voltages until the number of erroneous data bits $E_A$ in the programmer's data equals, or is less than, a predetermined (e.g., maximum) number of erroneous data bits, $E_T$, that storage manager 110 can correct. If $E_A \leq E_T$, storage manager 110 corrects the erroneous data bits and rewrites the programmer's data, with the corrected erroneous data bits, into memory cells 122 by using the first configuration of CSSM 130; i.e., by applying the conventional threshold voltage ranges and the conventional read reference voltages.

After storage device 100 is manufactured, programmer's data is preloaded into memory device 120 before storage device 100 is embedded in host 170, which may be, for example, a cellular phone or a digital camera. The programmer's data is preloaded into memory device 120 before the assembly phase takes place because preloading data to a storage device and executing various testing procedures to test the storage device after the storage device is embedded in the host requires significant changes in traditional host's manufacturing lines/processes, and such changes are costly. Therefore, after the programmer's data is preloaded to memory device 120, the testing is performed by programmer 160 before storage device 100 is embedded in the host device (e.g., host 170).

After the data preloading process is completed, storage device 100 is embedded in host 170 by using a reflow process. After storage device 100 is embedded in host 170, host 170 and storage device 100 are usually subject to normal ambient temperatures. However, during the reflow process, storage device 100 is subject to temperatures that are by far higher than the normal ambient temperature. As explained herein, the high soldering temperature results in degradation in data retention and, therefore, in data loss. Therefore, after storage device 100 is embedded in host 170, and assuming that storage device 100 is powered up by host 170, the programmer's data, or one or more selected parts thereof, stored in memory cells of memory cells 122 is/are read by using a conventional storage setup (i.e., the first configuration of CSSM 130), and the erroneous data bits in the programmer's data are detected and their number, $E_A$, is calculated. If $E_A \leq E_T$, storage manager 110 corrects the erroneous data bits and rewrites the restored programmer's data, or the one or more selected parts thereof, in memory cells 122. If, however, there are too many erroneous data bits for storage manager 110 to correct (i.e., $E_A > E_T$), storage manager 110 iteratively adjusts (i.e., lowers) the read reference voltages, as defined for the second configuration of CSSM 130, and rereads the programmer's data, this time with the adjusted read reference voltages, to thereby reduce the number of erroneous data bits, $E_A$, after each iteration.

The question whether all or selected parts of the programmer's data is/are (to be) read from and thereafter rewritten into memory cells 122, and how many read/write operations are required, depends on the extent to which the programmer's data is corrupted, and on how susceptible the memory cells, which hold that data, are to data read failures. In general, the programmer's data can be read from, and thereafter rewritten in memory cells 122, completely or partly. There are three options for reading and rewriting programmer's data from/into memory cells 122: (1) the programmer's data can be read and rewritten from/into memory cells 122 in its entirety by using one read operation and one write operation, or (2) the programmer's data can be read and rewritten from/into memory cells 122 in its entirety by using multiple read operations (i.e., reading the entire programmer's data one part at a time) and as many write operations, or (3) only selected parts of the programmer's data may be read from and thereafter rewritten into memory cells 122. Option (2) is beneficial in cases where the storage manager is busy doing other things and it may read/rewrite parts of the programmer's data as background operations. Option (3) is beneficial in cases where the reflow process does not severely affect some of the memory cells within memory cells 122 that initially store the programmer's data. In such cases, reading and rewriting only the data parts that are stored in severely affected memory cells may suffice. In other words, there is no need to read and rewrite data parts that are stored in negligibly affected memory cells. If particular memory cells within memory cells 122 are known in advance (e.g., empirically) to be storage-wise problematic, for example because they are severely susceptible to the reflow process, only part(s) of the programmer's data that is/are stored in the problematic memory cells may be read and thereafter rewritten into memory cells 122. Therefore, the memory cells from which part(s) of the programmer's data is/are (to be) read may be predetermined based on the cells' expected susceptibility to read failures.

When storage manager 110 is connected to programmer 160, it configures CSSM 130 in a way to operate memory cells 122 as MBC cells in a conventional way, by using the conventional threshold voltage ranges and the conventional read reference voltages pertaining to the used MBC scheme. Then, storage manager 110 temporarily writes the programmer's data into memory cells 122 (e.g., into a first group of cells 124) by using the conventional threshold voltage ranges and conventional read reference voltages. Assume that sometime after the programmer's data is initially written into the first group of cells 124 (for example), storage device 100 is soldered to circuit board 174 of host 170 during the assembling of host 170.

After host 170 is assembled, switching it "on" powers storage device 100 up. Shortly after storage device 100 is powered up by host 170, storage manager 110 reads the programmer's data from first group of cells 124. Storage manager 110 may read the programmer's data from first group of cells 124 one or more times, the number of times depending on whether erroneous data bits, which may be included in the programmer's data, can be corrected by storage manager 110. Storage manager 110 uses an Error Correction Code mechanism (i.e., ECC 190) to detect and correct erroneous data bits in the programmer's data. The maximum number of erroneous data bits in a given data block that storage manager 110 can correct depends on the "strength" of the used ECC code: the stronger the ECC code, the higher that number.

An ECC code is redundant data that is added to data that is stored in a memory device. If the number of erroneous data bits in the stored data is within the capability of the code, the storage device can use the redundant data to detect the locations of the erroneous data bits and correct them. A Reed Solomon code and BCH codes are exemplary ECC codes that can be used to detect and count erroneous data bits. By way of example, a Reed Solomon code denoted as "RS(204,188)" processes blocks of 188 bytes of useful information at a time, and appends 16 (204−188=16) redundant bytes to each block and handles eight incorrect bytes per data block.

Because storage manager 110 writes the programmer's data into memory cells 122 by using conventional threshold voltage ranges and conventional read reference voltages, the first time storage manager 110 reads the programmer's data from cells group 124 it reads it by applying the conventional threshold voltage ranges and the conventional read reference voltages. If the number of erroneous data bits $E_A$ in the read programmer's data is uncorrectable by storage manager 110, unconventional read reference voltages are used; that is, the read reference voltages are lowered (i.e., shifted to the left) to enable rereading the programmer's data from cells' group 124 with less erroneous data bits. Using low enough read reference voltages results in a number of erroneous data bits that can be corrected by storage manager 110.

After storage manager 110 corrects the programmer's data, it temporarily stores 152 it in a Random Access Memory ("RAM") 150. Thereafter, or concurrently, storage manager 110 reconfigures CSSM 130 in a manner to operate memory cells 122 as conventional MBC cells. Then, storage manager 110 reads 152 the data from RAM 150 and rewrites it into a second group of memory cells 122 (e.g., group 126 or group 128), this time by using the conventional threshold voltage ranges and the conventional read reference voltages pertaining to the used MBC storage setup. The first group of memory cells into which the programmer's data is temporarily written and the second group of memory cells into which the programmer's data is rewritten may be separate groups, as demonstrated by separate groups 124 and 128. Alternatively, the first group of memory cells and the second group of memory cells may have one or more memory cells in common, as demonstrated by the partial overlapping of groups 124 and 126. The second group of memory cells and the first group of cells include the same number of memory cells because the same data (i.e., the programmer's data) is written into them by using the same type of MBC storage setup (i.e., storing the same number of data bits; e.g., 2 bits, in each cell). If different MBC storage setups are used, the two groups of memory cells have different numbers of memory cells.

Storage manager 110 uses the first configuration of CSSM 130 to initially write the programmer's data into memory cells 122 if it "knows", such as by sensing or inferring, or by being notified by programmer 160, that storage device 100 is connected to programmer 160. Likewise, storage manager 110 timely uses one or both of the first configuration of CSSM 130 and the second configuration of CSSM 130 to read the programmer's data from memory cells 122 and to rewrite it into memory cells 122 if it "knows", such as by sensing or inferring, or by being notified by host 170, that storage device 100 is connected to host 170. Various example ways that enable storage manager 110 to determine if it is connected to programmer 160 or to host 170 are described below. Storage manager 110 may execute an application 112 to implement ECC 190 and to perform the various configurations of CSSM 130, steps, operations, determinations, etc. that are described herein. A firmware of storage device 100 may be safely be stored in separate memory device such as Read Only Memory ("ROM") 180.

Figure 2:
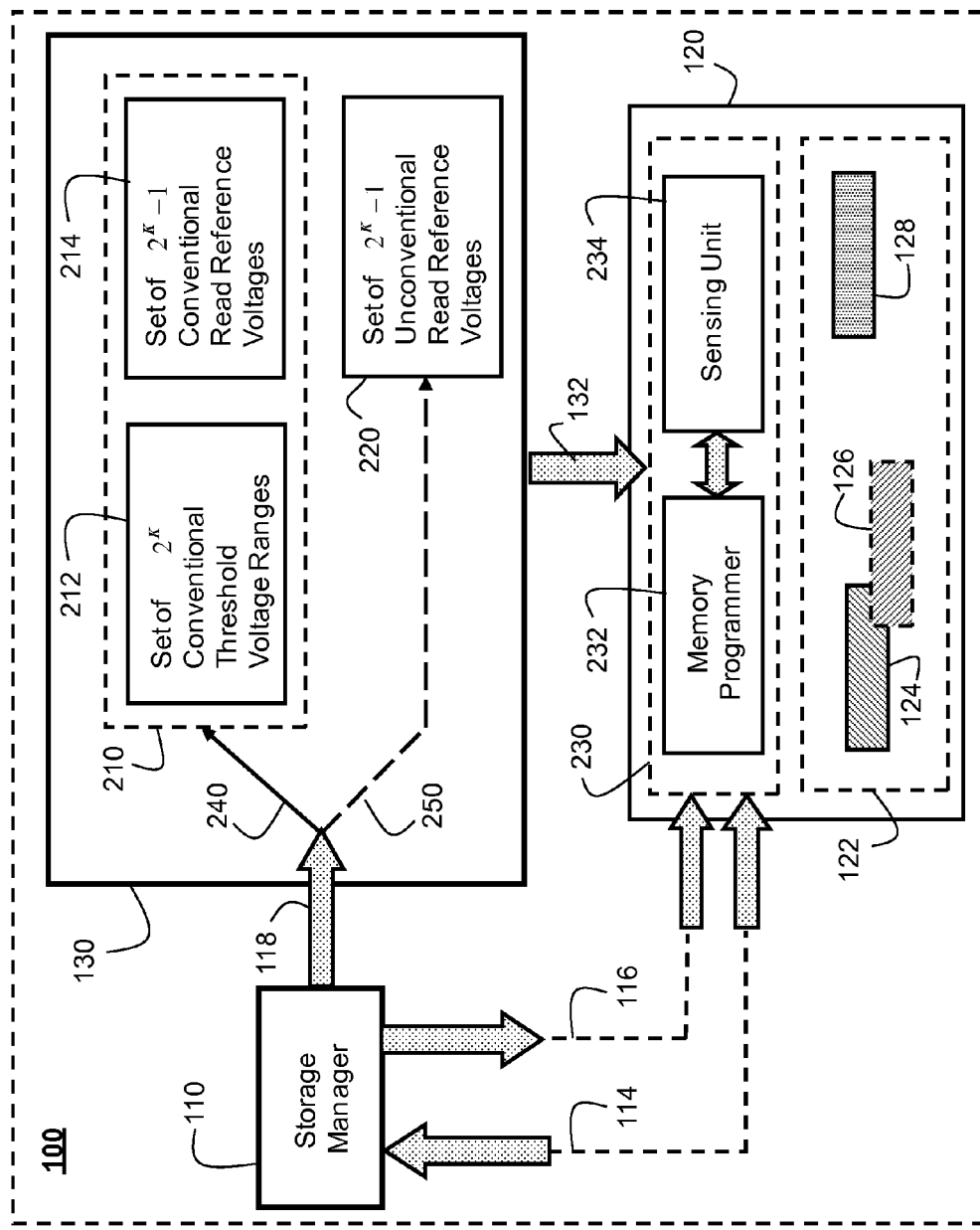
FIG. 2 shows some elements of the storage device of FIG. 1 in more details.

FIG. 2 is a block diagram of configurable storage setup module (CSSM) 130 according to an example embodiment. FIG. 2 will be described in association with FIG. 1. CSSM 130 is configured by storage manager 110, and thereafter used by storage manager 110, to selectively operate memory cells within memory cells 122 by using the MBC storage setup conventionally or unconventionally. Using the MBC storage setup unconventionally by storage manager 110 enables storage manager 110 to lower the level of read reference voltages until the programmer's data can be read correctly or with correctable erroneous data bits. CSSM 130 contains configuration information that is required to implement the conventional MBC storage setup (i.e., the first configuration of CSSM 130) and the unconventional MBC storage setup (i.e., the second configuration of CSSM 130). For convenience, the information required to implement the two storage setups is functionally divided into two parts: the information pertaining to the conventional MBC storage setup is shown at 210, and the information pertaining to the unconventional MBC storage setup is shown at 220. If storage manager 110 determines that the conventional MBC storage setup should be used, it sends 118 a command to CSSM 130 to select 240 information 210. If storage manager 110 determines that the unconventional MBC storage setup should be used, it sends 118 a command to CSSM 130 to select 250 information 220.

Information 210 includes information 212 that pertains to a set of $2^K$ conventional threshold voltage ranges. Information 210 also includes information 214 that pertains to a set of $2^K-1$ conventional read reference voltages. Information 212, in conjunction with information 214, defines the conventional MBC storage setup. For example, K=2 (i.e., memory cells of memory cells 122 are (to be) operated as 2 bit-per-cell cells) means that each of the memory cells of memory cells 122 (to be) operated as 2 bit-per-cell cell can be in one of the four ($2^2$) binary states "00", "01", "10", or "11" at a time. Therefore (continuing the example), information 212 pertains to four threshold voltage ranges/, each threshold voltage range/representing a particular one of the four binary states, and information 214 pertains to three read reference voltages. The terms "conventional MBC storage setup", "first configuration of CSSM 130", and "first storage setup" are used herein interchangeably to denote the same thing. Information 220 pertains to a set of $2^K-1$ unconventional, conventional read reference voltages. The terms "unconventional MBC storage setup", "second configuration of CSSM 130", and "second storage setup" are used herein interchangeably to denote the same thing.

Whenever storage manager 110 writes data into or reads data from memory cells 122, it determines which storage setup is relevant to the specific data writing and to the specific data reading. Based on the determination result, storage manager 110 instructs 118 CSSM 130 to select the information pertaining to the relevant storage setup. If storage manager 110 determines that the first storage setup is the relevant storage setup, it instructs 118 CSSM 130 to select information 210 (the selection of information 210 is shown at 240). If, however, storage manager 110 determines that the second storage setup is the relevant storage setup, it instructs 118 CSSM 130 to select information 220 (the selection of information 220 is shown at 250). By way of example, storage manager 110 is shown selecting 240 the first storage setup and deselecting 250 the second storage setup. Saying that CSSM 130 is using information 210 (or information 220) to operate memory cells 122 and saying that CSSM 130 is configured to operate the memory cells according to the first storage setup (or, if information 220 is selected, according to the second storage setup) are deemed equivalent.

Memory device 120 includes a programming unit 230. Programming unit 230 is responsible for the actual operation (e.g., programming) of memory cells 122. Programming unit 230 includes a memory programmer 232 and a sensing unit 234. In order to write data (e.g., programmer's data) into memory cells 122, storage manager 110 transfers the data to programming unit 230 with an address of the memory cells into which the data are be written. In order to enable programming unit 230 to write the data in memory cells 122 by using the correct storage setup, storage manager 110 transfers a storage setup selection command 118 to CSSM 130 to apply the correct information. Storage setup selection command 118 indicates to CSSM 130 which information should be used to write the data. Programming unit 230, then, receives 132 the selected information (e.g., information 210) from CSSM 130 and writes the data in memory device 120 accordingly.

Assume that the information transferred 132 from CSSM 130 to programming unit 230 is information 210. Storage manager 110 uses memory programmer 232 to write the data into memory cells of memory cells 122 by using the first storage setup. That is, after programming unit 230 receives (i) the data to be written in memory cells 122 (e.g., programmer's data), (ii) the pertinent cells' address, and (iii) the pertinent storage setup information (in this example information 210), storage manager 110 uses memory programmer 232 to stepwise program the pertinent memory cells (e.g., cells' group 124) while, during each programming step, memory programmer 232 increases the threshold voltage levels of the memory cells. After each programming step, storage manager 110 uses sensing unit 234 to detect the current binary states of the programmed memory cells by using the conventional read reference voltages specified in, or defined by, information 210. Then, storage manager 110 uses sensing unit 234 to determine whether the current binary states of the programmed memory cells have reached the target binary states. (A "target" binary state of a memory cell is the bitwise portion "xy", "xyz", etc. (where each of "x", "y" and "z" is a binary value"0" or "1") of the data that is to be stored in it). If a current binary state of a memory cell differs from the cell's target binary state, the memory cell undergoes an additional programming step. The process of increasing the threshold voltages of the memory cells and comparing the consequent binary states to the respective target binary states is reiterated until each of the programmed memory cells reaches its target binary state, i.e., until each programmed memory cell stores the bitwise portion of the data that is intended to be stored in it.

Storage manager 110 also uses sensing unit 234 to read data from memory cells 122. In order to read data from a memory cell, sensing unit 234 gradually increases the level of a voltage applied to the floating gate of the cell until electrical current starts to flow through the cell. The minimal voltage level at which electrical current starts to flow through a memory cell is the threshold voltage of the memory cell. As explained above, the threshold voltage of a memory cell indicates the binary state of the cell. Storage manager 110, therefore, uses sensing unit 234 to detect the threshold voltage levels of the memory cells. Then, storage manager 110 compares the cell's threshold voltage levels to one or more conventional read reference voltage levels that are specified in, or defined by, information 210 in order to determine the binary state of each memory cells.

While storage device 100 is connected to programmer 160, storage manager 110 uses CSSM 130 and programming unit 230 to write the programmer's data into memory cells 122 by using the first storage setup. After storage device 100 is embedded in host 170, storage manager 110 uses CSSM 130 and programming unit 230 to read the programmer's data from memory cells 122 by using the first storage setup first and, if there are too many erroneous data bits in the programmer's data, by using the second storage setup. Then, storage manager 110 uses CSSM 130 and programming unit 230 to rewrite the programmer's data into memory cells 122 by using the first storage setup.

FIG. 3A shows an example conventional MBC storage scheme. FIG. 3A will be described in association with FIG. 1 and FIG. 2. FIG. 3A refers to a case where K=2. That is, there are four binary states "A", "B", "C", and "D" that are respectively represented by four conventional threshold voltage distribution curves 310, 320, 330, and 340. Binary states "A", "B", "C", and "D" are detectable by using three conventional read reference voltages 350, 360, and 370. By way of example, conventional read reference voltages 350, 360, and 370 are, respectively, 0.5V, 2.5V, and 4.5V.

A memory cell is conventionally in binary state "A" if its threshold voltage resides within conventional threshold voltage distribution range 380; in binary state "B" if its threshold voltage resides within conventional threshold voltage distribution range 382; in binary state "C" if its threshold voltage resides within conventional threshold voltage distribution range 384, and in binary state "D" if its threshold voltage resides within conventional threshold voltage distribution range 386. Continuing the example, if the threshold voltage of a memory cell is higher than 4.5V, the cell is in state "D"; if the threshold voltage of the memory cell is within the range 2.5V to 4.5V, the cell is in state "C", etc.

If storage manager 110 determines that storage device 100 is connected to a programming device (e.g., programmer 160), it stores the data it receives from it (i.e., the programmer's data) in memory cells 122 by using the MBC storage setup conventionally, by causing CSSM 130 to select information 210, and, by doing so, causing programming unit 230 to operate memory cells 122 according to the first storage setup. Referring to FIG. 3A, K=2, information 212 defines a set of four ($2^2$) conventional threshold voltage ranges 380, 382, 384 and 386, and information 214 defines a set of three ($2^2-1$) conventional read reference voltages 350, 360, and 370.

FIG. 3B demonstrates unconventional read reference voltages by which corrupted data are read according to an example embodiment. FIG. 3B also demonstrates the detrimental effect of the reflow process on the conventional threshold voltage distribution curves 310, 320, 330, and 340 of FIG. 3A. FIG. 3B will be described in association with FIG. 1, FIG. 2 and FIG. 3A. While host 170 is assembled, the reflow process causes memory cells 122 to lose electric charge. In other words, the (heat generated during the) reflow process shifts the conventional threshold voltages of memory cells leftward or, in other words, the reflow process lowers the threshold voltages of the cells. Different memory cells may experience different temperatures during the same soldering process. This phenomenon and the erratic behavior of memory cells cause memory cells 122 to lose electric charge unevenly (e.g., some memory cells lose more electric charge than others under the same mechanical stress). Therefore, while FIG. 3A shows conventional threshold voltage distribution curves 310, 320, 330, and 340 before storage device 100 is embedded in host 170, FIG. 3B shows the unconventional threshold voltage curves that result from the effect of the reflow process on these curves: conventional threshold voltage distribution curve 310 is transformed (i.e., shifted and reshaped) to unconventional threshold voltage curve 312; conventional threshold voltage distribution curve 320 is transformed to unconventional threshold voltage curve 322; conventional threshold voltage distribution curve 330 is transformed to unconventional threshold voltage curve 332; and conventional threshold voltage distribution curve 340 is transformed to unconventional threshold voltage curve 342.

The deviation (both location wise and shape wise) of an unconventional threshold voltage distribution curve from the respective conventional threshold voltage distribution curve depends on several factors, among which the soldering temperature; soldering period and the erratic behavior of individual memory cells are predominant. After the embedding process is completed, some of the unconventional threshold voltage distribution curves that are derived from the conventional threshold voltage distribution curves 310, 320, 330, and 340 may respectively be located more rightward or more leftward and/or be narrower or wider than threshold voltage distribution curves 312, 322, 332, and 342. For example, unconventional threshold voltage distribution curve 332 may be closer to read reference voltage 350 and/or be wider.

After storage device 100 is embedded in, and powered up by, host 170, storage manager 110 cannot know how many erroneous data bits there are in the programmer's data before it reads it. Therefore, storage manager 110 reads the programmer's data by using the same conventional read reference voltages (i.e., read reference voltages 350, 360 and 370) that were used to preload the programmer's data to the first group of memory cells (e.g., group 124). After storage manager 110 reads the programmer's data from the first group of memory cells and temporarily stores it in another memory device (e.g., RAM 150), storage manager 110 detects the erroneous data bits in the programmer's data, for example by using ECC 190.

Read reference voltages are represented by numbers (e.g., "0.5" for read reference voltage 350) against which physical threshold voltages of memory cells are compared in order to determine the binary states of the memory cells. Normally (i.e., after a host is assembled and it interoperates with a storage device under normal conditions), the numbers designating the used read reference voltages are invariable. However, according to the present disclosure, these numbers are stepwise varied after storage device 100 is embedded in host 170 in order to reduce the number of erroneous data bits in the programmer's data to a number that storage manager 110 can correct. In other words, storage manager 110 selects (and if required changes the selection) and uses alternative, unconventional, read reference voltages to read the programmer's data from memory cells 122. Thereafter, if the erroneous data bits detected in the programmer's data are correctable by storage manager 110, storage manager 110 corrects them and selects and uses conventional read reference voltages to rewrite the corrected programmer's data into memory cells 122 (i.e., recondition the programmer's data).

Experience shows that trying to read the programmer's data from memory cells whose conventional threshold voltage distribution curves have changed by applying conventional read reference voltage oftentimes results in uncorrectable number of erroneous data bits. Assume that the programmer's data is such that some of the memory cells that hold that data are in binary state "A"; other memory cells are in binary state "B"; other memory cells are in binary state "C"; and the remaining memory cells are in binary state "D". As shown in FIG. 3B, the leftward shift (i.e., decrease) of threshold voltage distribution curve 310 is insignificant because the shifted curve 312 resides to the left of read reference voltage 350 in its entirety (i.e., all the cells originally programmed to binary state "A" remain in binary state "A" regardless of the left shift of their threshold voltages).

By way of example, a small segment of threshold voltage distribution curve 322, which is shown in FIG., 3B as a thick line, resides to the left of conventional read reference voltage 350. This means that some memory cells that were originally programmed to binary state "B" transitioned to binary state "A". A memory cell that transitions from one binary state to another (e.g., from binary state "B" to binary state "A") includes at least one erroneous data bit. The more transitions there are, the greater is the number of the erroneous data bits. Continuing the example, a larger segment of threshold voltage distribution curve 332 (which is also shown in FIG. 3B as a thick line) resides to the left of conventional read reference voltage 360. This means that more memory cells transitioned from binary state "C" to binary state "B" than from binary state "B" to binary state "A". Continuing the example, an even larger segment of threshold voltage distribution curve 342 (which is also shown in FIG. 3B as a thick line) resides to the left of conventional read reference voltage 370. This means that more memory cells transitioned from binary state "D" to binary state "C" than from binary state "C" to binary state "B".

The total number of erroneous data bits, $E_A$, in the programmer's data is, therefore, a sum of the erroneous data bits that are caused by each type of transition (i.e., transition from binary state "D" to binary state "C", etc.). Storage manager 110 can correct up to a maximum number of erroneous data bits, $E_T$, that depends on the type of ECC 190. If $E_A<E_T$, storage manager 110 corrects the erroneous data bits and refreshes (i.e., reconditions) the data. If, however, $E_A>E_T$, storage manager 110 instructs 118 CSSM 130 to select 250 and use information 220 that, as explained above, pertains to unconventional read reference voltages. An unconventional read reference voltage is a "lowered version" of the respective conventional read reference voltage. Using a lowered conventional read reference voltage and using an unconventional read reference voltage that is a lowered version of the conventional read reference voltage refers to the same thing. Read reference voltages 352, 362, and 372, which are referred to or defined by information 220, are exemplary unconventional read reference voltages. Unconventional read reference voltage 352 is a lowered version of conventional read reference voltage 350; unconventional read reference voltage 362 is a lowered version of conventional read reference voltage 360; and unconventional read reference voltage 372 is a lowered version of conventional read reference voltage 370.

Applying unconventional read reference voltages 352, 362, and 372 as alternative to conventional read reference voltages 350, 360, and 370, results in less erroneous data bits because, by applying read reference voltage 352, the memory cells that previously transitioned from binary state "B" to binary state "A" have resumed their binary state "B", and by applying read reference voltages 362 and 371, less memory cells transition from binary state "C" to binary state "B" and from binary state "D" to binary state "C". If applying unconventional read reference voltages 352, 362, and 372 still results in an uncorrectable number of erroneous data bits, the read reference voltages are further lowered to further reduce the number of erroneous data bits in the programmer's data. Example read reference voltages with further lowered levels are shown at 354, at 364, and at 374.

Using unconventional read reference voltages 354, 364, and 374 as new alternative read reference voltages results in fewer erroneous data bits because, due to read reference voltage 354 memory cells do not transition from binary state "B" to binary state "A" (curve 322 is on the right side of read reference voltage 354 in its entirety); and, due to read reference voltage 364 memory cells do not transition from binary state "C" to binary state "B" (curve 332 is on the right side of read reference voltage 364 in its entirety), and fewer memory cells transition from binary state "D" to binary state "C". Therefore, up to a certain point, each decrease in the levels of the read reference voltages results in less erroneous data bits in the programmer's data.

Figure 4:
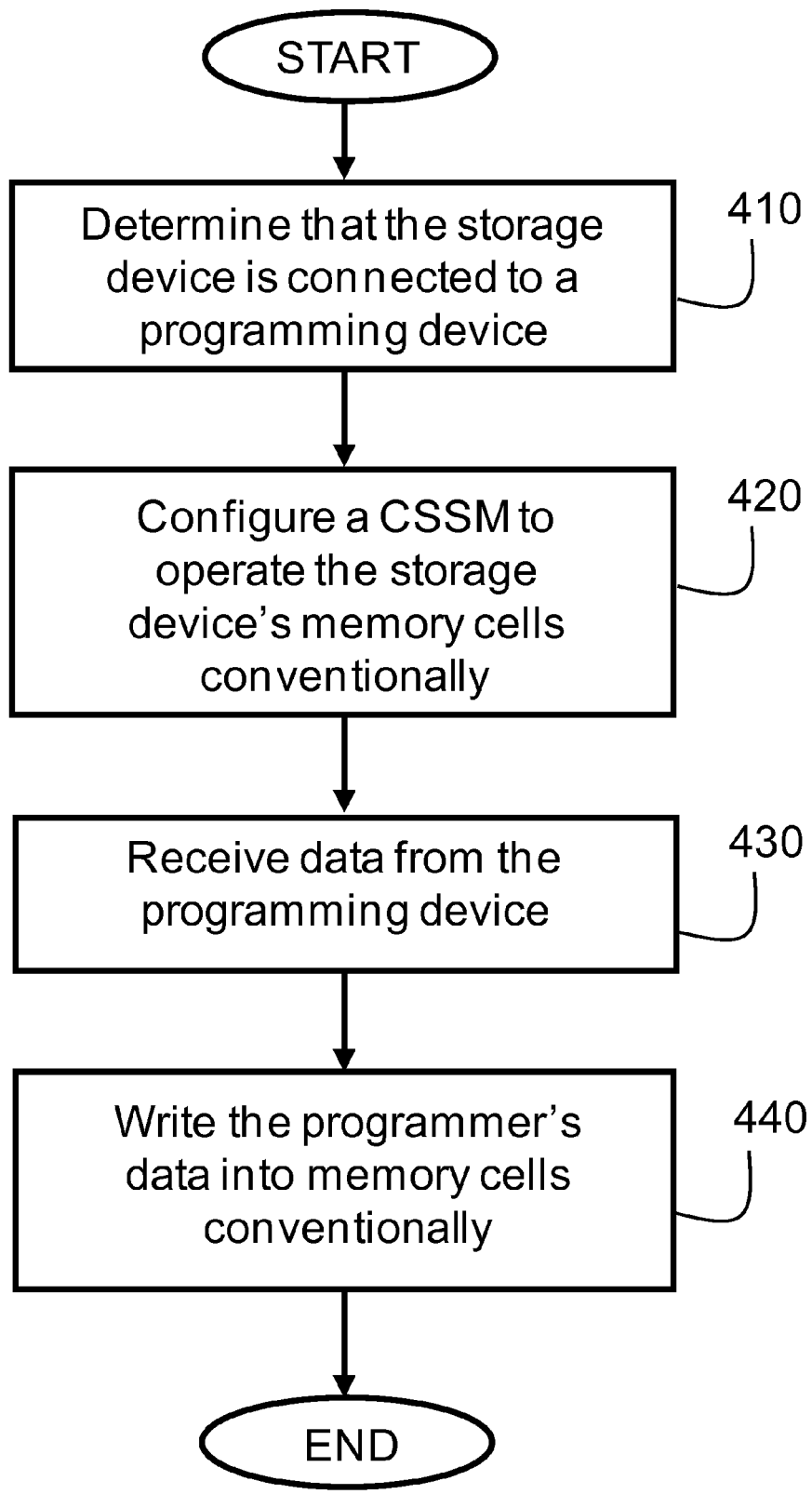
FIG. 4 is a method for preloading programmer's data into a storage device.

FIG. 4 is a method for preloading data into a storage device in a conventional way. FIG. 4 will be described in associated with FIG. 1 and FIG. 2. Assume that storage device 100 is connected to a programming device (e.g., programmer 160). At step 410, storage manager 110 determines that storage device 100 is connected to programmer 160. At step 420, while storage device 100 is connected to programmer 160 storage manager 110 configures CSSM 130 to operate a first group of memory cells (e.g., group 124) conventionally, according to a first storage setup. In other words, storage manager 110 instructs CSSM 130 to select and apply information 210 on the first group of memory cells. At step 430, storage manager 110 receives the programmer's data (e.g., GPS maps, etc.) from programmer 160 and, at step 440, storage manager 110 uses CSSM 130 to write the programmer's data into cells' group 124 (for example) by using the first storage setup. Information 210 may pertain to, or define, the MBC scheme embodied in conventional threshold voltage distribution curves 310, 320, 330 and 340, and conventional read reference voltages 350, 360, and 370.

As explained above, the first storage setup enables storage manager 110 to conventionally program each of memory cells 122 to a particular one of $2^K$ binary states, to thereby store K data bits in each memory cell that is so programmed. As demonstrated in FIG. 3A and in FIG. 3B, K equals 2. However, the disclosure is likewise applicable to cases where K is greater than 2. When storage device 100 is connected to programmer 160, storage manager 110 uses the first storage setup to write the programmer's data into the first group of memory cells by programming each of the group's memory cells to a particular one of the $2^K$ binary states, where each of the $2^K$ binary states is represented by a particular one of a first set (i.e., conventional set) of $2^K$ threshold voltage ranges. Storage manager 110 also uses the first storage setup to initially read the data from the first group of memory cells by distinguishing between the $2^K$ binary states by applying a first set (i.e., conventional set) of $2^K-1$ read reference voltages or a second set (i.e., unconventional set) of $2^K-1$ read reference voltages. After storage manager 110 reads the data with zero or correctable number of erroneous data bits, either by using the conventional or unconventional set of $2^K-1$ read reference voltages, it rewrites the programmer's data into a second group of memory cells (e.g., group 126 or group 128, or another group) by using the first storage setup; i.e., by using the conventional set of $2^K$ threshold voltage ranges and conventional set of $2^K-1$ read reference voltages.

Storage manager 110 has several ways to "know" if it is connected to programmer 160 or to host 170: (1) storage manager 110 may receive from programmer 160 information or signal that indicates that the data about to be transferred to it is a programmer data, (2) storage manager 110 may receive an explicit command from programmer 160 to store the data by using the first storage setup, or (3) storage manager 110 may use an internally/locally-based decision making mechanism, as elaborated below.

Storage manager 110 may determine that storage device 100 is connected to programmer 160 autonomously, based/contingent on any one of: a command received from programmer 160 and one or more data storage requests that storage manager 110 receives from programmer 160. Storage manager 110 may select the first storage setup as a default storage setup prior to or consequent to receiving first data. (Note: it is assumed that storage manager 110 "knows" if the data it receives for storage in memory cells 122 is "first data", "second data", etc, as it manages the data storage, and, therefore it may assume that the first data is transferred to it from a programming device). Alternatively, programmer 160 notifies storage manager 110 that it is communicating with a programming device. For example, programmer 160 may use a dedicated command or indication to notify storage manger 110 that it is connected to a programming device. Programmer 160 may send such a command or notification to storage manager 110 before programmer 160 commences any data transfer session with storage manager 110. Alternatively, storage manager 110 may know that it is communicating with programmer 160 by detecting a specific data string (e.g., a specific prefix, a specific suffix, etc.) in the data, or in a metadata associated with the data, which is uniquely used by programming devices but not by hosts.

Figure 5:
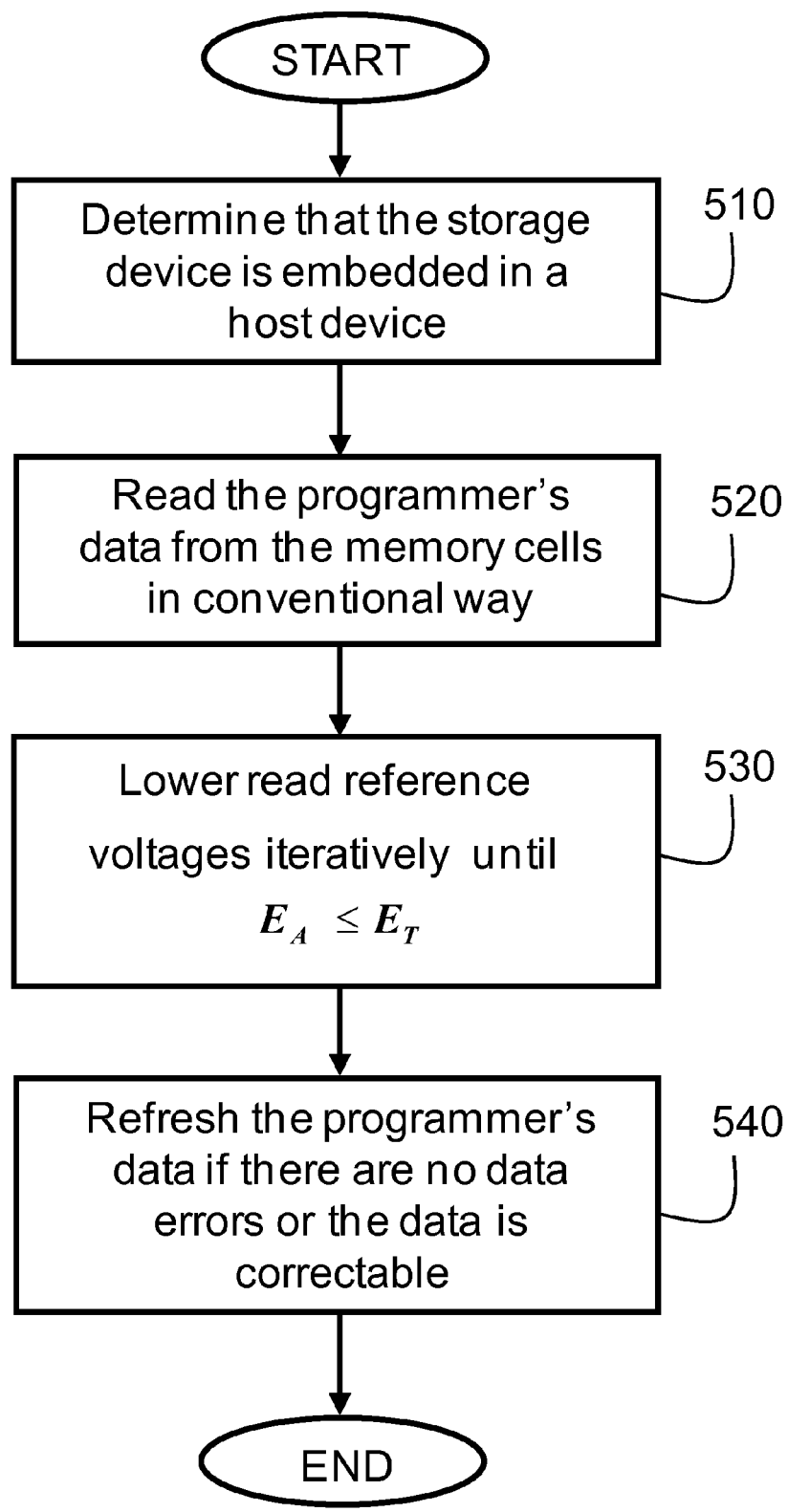
FIG. 5 is a method for restoring programmer's data according to an example embodiment.

FIG. 5 is a method for restoring programmer's data according to an example embodiment. FIG. 5 will be described in association with FIG. 1 and FIG. 2. Assume that storage device 100 is embedded in host 170 in order to allow the host's user to use the programmer's data (e.g., GPS maps, video clips and songs, etc.) preloaded into storage device 100 by programmer 160. At step 510, storage manager 110 determines that storage device 100 is embedded in host 170 and contains preloaded data (i.e., programmer's data). While the storage device 100 is embedded in host 170, storage manager 110 configures CSSM 130 to read the programmer's data or selected parts thereof, at step 520, from the first group of memory cells (e.g., from group 124) conventionally, by using the first storage setup. When storage device 100 is connected to programmer 160, storage manager 110 configures CSSM 130 to operate the first group of memory cells according to the first storage setup, and it maintains the first storage setup configuration in order to read the programmer's data, or the selected parts thereof, from the first group of memory cells conventionally, after it is powered up by host 170.

Assuming that the programmer's data that was read conventionally at step 520 includes $E_A$ erroneous data bits that cannot be corrected by storage manager 110, storage manager 110 reconfigures CSSM 130, at step 530, to use a set of unconventional read reference voltages; rereads the programmer's data by using the unconventional set of read reference voltages, and recalculates the number of erroneous data bits, $E_A$, in the reread programmer's data. Storage manager 110 reiterates step 530 until the number of erroneous data bits, $E_A$, in the programmer's data is correctable (i.e., until $E_A \leq E_T$) by storage manager 110. Step 530 is explained in extenso below in connection with FIG. 6.

At step 540, storage manager 110 corrects the erroneous data bits in the programmer's data and rewrites the corrected programmer's data, or one or more selected parts thereof, into a second group of memory cells (e.g., group 126) by using the first storage setup. That is, after storage manager 110 restores the programmer's data, it reverts to, reinstates, or reuses the first storage setup to rewrite the programmer's data in memory cells 122. Storage manager 110 may, then, refresh the programmer's data, or some of it. It may occur that the programmer's data is so corrupted by the reflow process that storage manager 110 cannot correct it no matter how low the read reference voltages are. In such cases, storage manager 110 may send a message to host 170 that the programmer's data is uncorrectable. Storage manager 110 may notify the host device about the uncorrectable data after the steps of rereading the programmer's data and recalculating the number of erroneous data bits in the reread programmer's data are reiterated a predetermined number of times, or if one or more of the pertinent read reference voltages have reached a predetermined level (e.g., 75% of their initial level) and the erroneous data bits are still uncorrectable.

There are several ways by which storage manager 110 may determine that it is connected to host 170: (1) storage manager 110 may receive from host 170 information or signal indicates that it is communicating with a host device, (2) storage manager 110 may receive an explicit command from host 170 to read the programmer's data from the first group of cells by initially using the first storage setup and, if required, by using the second storage setup, and, after erroneous data bits are corrected in the programmer's data, to rewrite the corrected programmer's data into the second group of cells by reusing the first storage setup, (3) storage manager 110 may use an internally/locally-based decision making mechanism or circuitry, as elaborated below.

Storage manager 110 may determine that storage device 100 is embedded in host 170 autonomously, for example based/contingent on any one of: a command it receives from host 170, specific data or specific data string it receives from host 170, and one or more data storage requests it receives from host 170, which match a predetermined pattern. In order to read the programmer's data from the first group of memory cells, storage manager 110 may initially use the first storage setup as the default storage setup after it is powered up by host 170 or while it communicates with host 170. Assuming that storage manager 110 knows how many times it is powered up, when it is powered up for the second time, storage manager 110 may assume that it is powered up by a host device. Consequent to the second power up of storage manager 110, storage manager 110 reads the programmer's data, or part thereof, by using the first storage setup and, to the extent required, the second storage setup, and, after the programmer's data is corrected, rewrites it by reusing the first storage setup.

Regarding the programmer's data string mentioned above, if storage manager 110 is communicating with a device and does not receive the unique data string, storage manager 110 assumes that it is communicating with a host device and acts accordingly. Alternatively, 110 may know that it is communicating with host 170 by receiving from host 170 a specific data string (e.g., a specific prefix, a specific suffix, etc.) that is uniquely used by host devices and not by programming devices. Alternatively, storage manager 110 may determine that it is connected to host 170 if it receives from host 170 a request to write a second data (i.e., data other than the programmer's data) into one or more memory cells, and these memory cells are accessible by using Logical Block Addressing ("LBA") addresses that exceed a predetermined limit or range. Alternatively, storage manager 110 may determine that it is connected to host 170 if it receives from host 170 a request to write the second data by using LBA address "m" and a subsequent request to write third data using LBA address "n" such that n is less then or equal to m. Alternatively, storage manager 110 may determine that it is connected to host 170 if it receives from host 170 a request to write data using an LBA address which is already in use. Alternatively, storage manager 110 may determine that it is connected to host 170 if it receives from host 170 a request to write an overly sized data into the storage device. "Overly sized data" may be, for example, data whose size is approximately half the size of the storage capacity of the involved storage device. Alternatively, storage device 100 may include an electrical terminal and circuit for generating a signal for storage manager 110 by which storage manager 110 determines whether it is connected to a programming device (e.g., programmer 160) or embedded in a host (e.g., host 170). If storage device 100 already stores data when it is powdered up by a host for the first time, storage manager 110 may determine that the data already stored in the storage device is (the) programmer's data. Storage manager 110 may determine that storage device 100 does not contain preloaded data. Consequent to the determination that storage device 100 does not contain preloaded data, storage manager 110 may permanently configure CSSM 130 to operate memory cells 122 according to the first storage setup.

Figure 6:
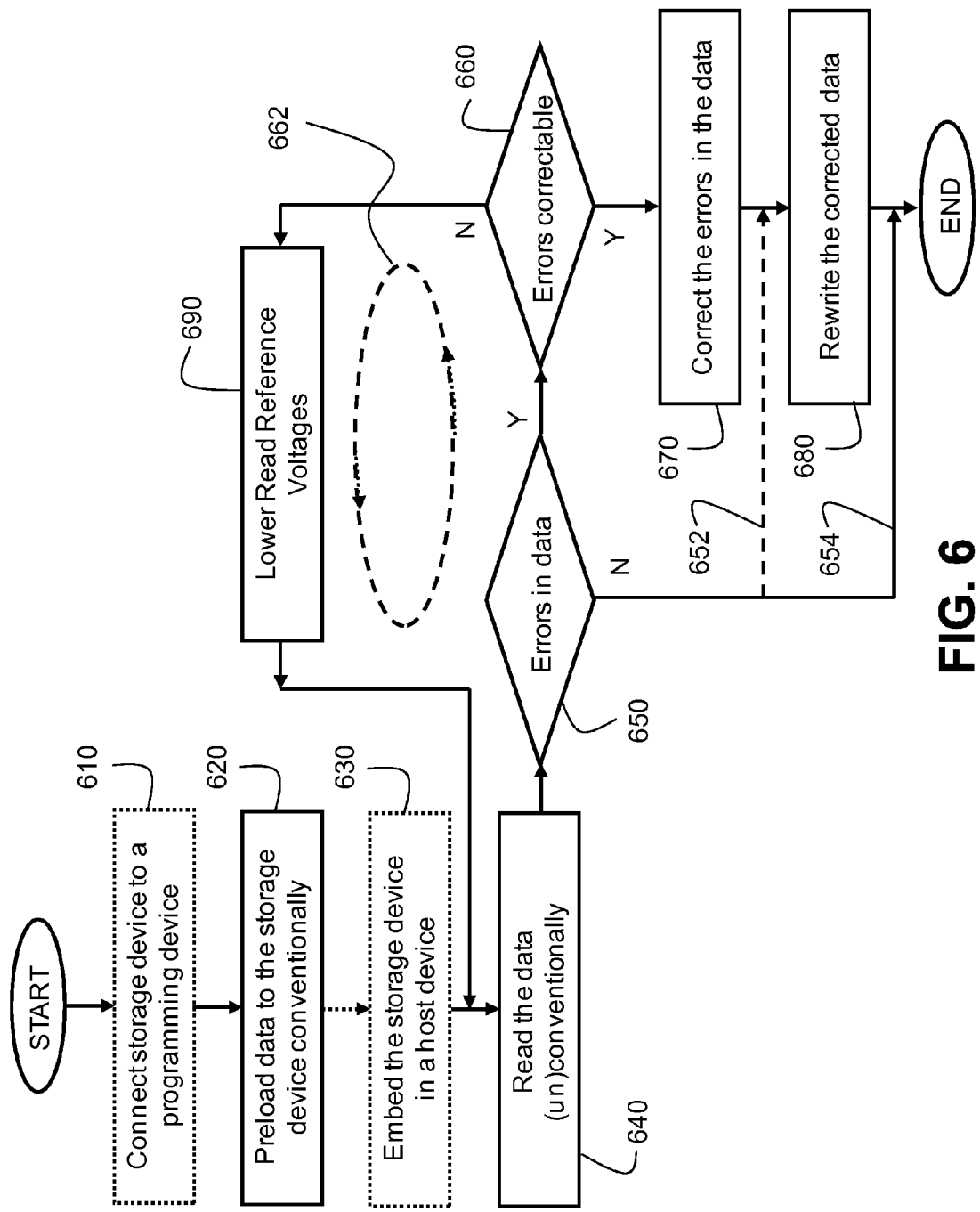
FIG. 6 is a method for preloading data into a storage device according to an example embodiment.

FIG. 6 is a method for preloading data into a storage device according to an example embodiment. FIG. 6 will be described in association with FIGS. 1, 2, 3A, and 3B. FIG. 6 shows two steps that are performed manually: step 610 is performed by the manufacturer of storage device 100, and step 630 is performed by the manufacturer of host 170. At step 610, the storage device's manufacturer connects storage device 100 to programmer 160 and, at step 630, the host's manufacturer/assembler embeds storage device 100 in host 170. At step 620, the manufacturer of storage device 100 (or someone else) preloads programmer's data to a first group of memory cells 122 (e.g., group 124) in a conventional way, by using the first storage setup; namely, by using the MBC storage scheme conventionally. After storage device 100 is embedded in host 170, storage manager 110 reads, at step 640, the programmer's data, or one or more selected parts thereof, from the first group of memory cells by using the MBC storage scheme conventionally; namely, by using conventional read reference voltages, or, to the extent required, unconventionally; namely, by using unconventional read reference voltages. That is, step 640 is reiterated such that the reading operation starts by using conventional read reference voltages, and, then, to the extent required (see step 660), by using unconventional read reference voltages. As explained above, the conventional read reference voltages are referred to, or defined, by information 214, and the unconventional read reference voltages are referred to, or defined, by information 220.

At step 650, storage manager 110 uses ECC 190 to detect erroneous data bits in the programmer's data. If $E_A$=0, which means that there are no erroneous data bits in the programmer's data (shown as "N" at step 650), storage manager 110 refrains from using the second storage setup (i.e., information 220). Storage manager 110 may decide to refresh 652 the programmer's data, at step 680, or to refrain 654 from refreshing the programmer's data. If $E_A$>0, which means that there are some erroneous data bits in the programmer's data (shown as "Y" at step 650), storage manager 110 checks, at step 660, whether the number of the erroneous data bits is correctable. As explained above, erroneous data bits are correctable if the number of the erroneous data bits, $E_A$, is less than or equal to the maximum number of erroneous data bits, $E_T$, that can be corrected by the used ECC (e.g., ECC 190). If the erroneous data bits are correctable by using ECC 190 (shown as "Y" at step 660); namely, if $E_A \leq E_T$, storage manager 110 refreshes the programmer's data by correcting the erroneous data bits, at step 670 (by using ECC 190), and by rewriting the programmer's data, at step 680, in memory cells 122. If, however, the erroneous data bits are uncorrectable (shown as "N" at step 660); namely, $E_A > E_T$, storage manager 110 iteratively uses loop 662 to reduce the number of erroneous data bits. The iteration loop 662 is terminated when the condition specified at step 680 (i.e., $E_A \leq E_T$) is met.

At step 690, storage manager 110 instructs CSSM 130 to select information 220 to reread the programmer's data. With reference to the exemplary unconventional read reference voltages of FIG. 3B, information 220 pertains to or defines unconventional read reference voltages 352, 362, and 372. Read reference voltages 352, 362, and 372 have levels that are respectively lowered relative to the levels of conventional read reference voltages 350, 360, and 370, as explained above. By way of example, the level of conventional read reference voltage 370 is 4.50V and the level of unconventional read reference voltage 372 is, say, 4.40V; the level of conventional read reference voltage 360 is 2.50V and the level of unconventional read reference voltage 362 is, say, 2.40V, and the level of conventional read reference voltage 350 is 0.50V and the level of unconventional read reference voltage 322 is, say, 0.40V.

After CSSM 130 is instructed 118 to select unconventional read reference voltages 352, 362, and 372, storage manager 110 uses them to reread the programmer's data, at step 630. At steps 650 and 660, storage manager 110 respectively rechecks whether there are still erroneous data bits in the programmer's data and, if there are, whether they can be corrected. If they still cannot be corrected (i.e., $E_A > E_T$), the levels of the read reference voltages are further lowered (i.e., unconventional read reference voltage with lowered levels are applied).

By way of example, the levels of the used read reference voltages are further lowered to the levels shown at 374, 364, and 354. By way of example, the level of unconventional read reference voltage 374 is 4.30V, as opposed to 4.40V of unconventional read reference voltage 372; the level of unconventional read reference voltage 364 is 2.30V, as opposed to 2.40V of unconventional read reference voltage 362, and the level of unconventional read reference voltage 354 is 0.30V, as opposed to 0.40V of unconventional read reference voltage 352.

After CSSM 130 selects unconventional read reference voltages 354, 364, and 374, storage manager 110 uses them to reread the programmer's data, at step 630. At steps 650 and 660, storage manager 110 respectively rechecks again whether there are still erroneous data bits in the programmer's data and, if there are, whether they can be corrected. If they cannot be corrected, steps 690, 640, 650, 660 are reiterated with read reference voltages whose levels are respectively further lowered relative to the levels of read reference voltages 354, 364, and 374. Otherwise (the erroneous data bits can be corrected), steps 670 and 680 are performed as explained above.

As demonstrated in FIG. 3B, the levels of the read reference voltages used for the data readings are lowered evenly across read reference voltage groups 356, 366, and 376, and linearly within each of the groups. Namely, the differences between read reference voltage 350 and read reference voltage 352, between read reference voltage 360 and read reference voltage 362, and between read reference voltage 370 and read reference voltage 372 are 0.1V, hence the even difference. The differences between read reference voltage 352 and read reference voltage 354, between read reference voltage 362 and read reference voltage 364, and between read reference voltage 372 and read reference voltage 374 are also 0.1V, hence the linear decrease within each group of read reference voltages. The read reference voltages used to (re)read the programmer's data may be lowered unevenly, as reasoned and exemplified below. Since the effect of the reflow process is greater on memory cells with high threshold voltages than on memory cells with low threshold voltages, the level of read reference voltage 370 may be lowered to a greater extent than the level of read reference voltage 360. For the same reason, the level of read reference voltage 360 may be lowered to a greater extent than the level of read reference voltage 350. For example, the level of read reference voltage 370 may be lowered from 4.5V to 4.2V ($\Delta V_{D,C}$=0.30V, where "$\Delta V_{D,C}$" refers to the read reference voltage used to distinguish between binary states "D" and "C"); the level of read reference voltage 360 may be lowered from 2.5V to 2.3V ($\Delta V_{C,B}$=0.20V, where "$\Delta V_{C,B}$" refers to the read reference voltage used to distinguish between binary states "C" and "B"); and the level of read reference voltage 350 may be lowered from 0.5V to 0.4V ($\Delta V_{B,A}$=0.10V, where "$\Delta V_{B,A}$" refers to the read reference voltage used to distinguish between binary states "B" and "A").

Alternatively or additionally, the programmer's data may be read from the first group of memory cells by applying read reference voltages whose levels are lowered non-linearly, as reasoned and exemplified below. As explained above, the effect of the reflow process is greater on memory cells with high threshold voltages than on memory cells with low threshold voltages. Therefore, the level of read reference voltage 370 may be lowered to a greater extent in the first reading iteration and to a lesser extent in consecutive iterations. For example, referring to read reference voltages group 376, the level of the read reference voltage located between binary states "D" and "C" may be lowered from 4.5V to 4.2V ($\Delta V_{D,C}$=0.3V) in the first iteration; from 4.2V to 4.0V ($\Delta V_{D,C}$=0.2V) in the second iteration; from 4.0V to 3.9V ($\Delta V_{D,C}$=0.1V) in the third reading iteration, and so on.

Information 220 of FIG. 2 may pertain to or define (the) individual target read reference voltages for each group of read reference voltage. For example, information 220 may contain information that pertains to or defines read reference voltages 352 and 354 in group 356, read reference voltages 362 and 364 in group 366, and read reference voltages 372 and 374 in group 376. In one example, only the voltage differences between read reference voltages that are used in a current iteration (e.g., voltage differences 390 and 392) and the read reference voltages to be used in the next iteration are specified in information 220. For example, information 220 may specify a voltage difference (i.e., voltage step) of 0.3V between read reference voltage 370 and read reference voltage 372, a voltage difference/step of 0.2V between read reference voltage 372 and read reference voltage 374, etc. In another example, the leftward shift of a read reference voltage is correlated to or contingent on the number of erroneous data bits in the programmer's data: the more erroneous data bits there are, the larger is the leftward shift of the read reference voltage. For example, read reference voltage 370 may be shifted to the left, say, 0.6V if the number of erroneous data bits in the programmer's data is, say twice the maximum correctable number $E_A$ of erroneous data bits, or 0.4V if it is, say, 1.3 times that number, etc. Information 220 may specify the dependency/correlation between the actual number of erroneous data bits in the programmer's data and the leftward shifts of one or more read reference voltage. The voltage steps used to lower the read reference voltages may be narrowed as the erroneous data bits reduction process described above is reiterated.

FIG. 7 shows an electrical terminal 730 and circuit 740 for generating a connectivity signal for storage manager 110 according to an example embodiment. FIG. 7 will be described in association with FIG. 1. Storage device 100 includes a set of conventional terminals 710, and programmer 160 includes a set of conventional terminals 720. When storage device 100 and programmer 160 are connected (in order to preload data to memory cells 122), each of terminals 710 contacts a terminal of terminals 720. Some of terminals 710 and 720 facilitate transfer of electrical power from programmer 160 to power up storage device 100, and other terminals of terminals 710 and 720 facilitate communication and data transfers between the two devices.

Storage device 100 includes an electrical terminal 730 for receiving a first signal from programmer 160 (e.g., first signal 762) regarding connection of storage device 100 to programmer 160, or from host 170 regarding connection of storage device 100 to host 170. Storage device 100 also includes circuitry 740 that is functionally interposed between electrical terminal 730 and storage manager 110. Circuitry 740 generates a second signal 750 from the first signal 762. Second signal 750 indicates to storage manager 110 whether storage device 100 is connected to programmer 160. Second signal 750 is referred to hereinafter as the "connectivity signal". Connectivity signal 750 is switchable between a "High" state and a "Low" state. By way of example, connectivity signal 750 is forced to the "High" state externally, by programmer 160, to thereby indicate to storage manager 110 that storage device 100 is currently connected to a programming device. Connectivity signal 750 is forced to the "Low" state internally when storage device 100 is powered up by a device which is not a programming device, for example by host 170. Storage manager 110, therefore, determines whether the storage device 100 is connected to programmer 160 or embedded in host 170 based on whether connectivity signal 750 is in the "High" state or in the "Low" state. Connectivity signal 750 is generated as described below. Programmer 160 includes a terminal 760 that contacts terminal 730 when the two devices are engaged. Terminals 730 and 760 are referred to herein as "connectivity terminals". (Note: unlike storage device 100 and programmer 160, host 170 does not have a connectivity terminal) As shown in FIG. 7, connectivity terminal 760 is internally connected to first signal 762 which, in this example, is reference voltage "+V" (e.g., +5V). Therefore, when storage device 100 is connected to programmer 160, reference voltage 762 is transferred from connectivity terminal 760 to circuit 740 via connectivity terminal 730. By way of example, circuit 740 includes a pull-down resistor 742 and a signal amplifier 744 whose voltage gain (G) may equal +1 (i.e., unity amplifier). Reference voltage 762 is fed to an input terminal 770 of signal amplifier 744, and, assuming that G=+1, signal amplifier 744 outputs a voltage (i.e., connectivity signal 750, the second signal mentioned above) whose level is substantially the same level as the level of the input voltage "+V". That is, the connectivity signal 750 is in the "High" state. The value of G may differ from +1 and, in such a case, connectivity signal 750 may be thought of as being in the "High" state if its voltage level is greater than a predetermined value (e.g., greater than 60% of the level of reference voltage 762).

FIG. 8 shows the storage device of FIG. 7 and a conventional host device. FIG. 8 will be described in association with FIG. 1 and FIG. 7. When storage device 100 is disconnected from programmer 160 and embedded in host 170, connectivity terminal 730 of storage device 100 is forced to the ground potential (i.e., "Gnd.", shown at 732) through pull-down resistor 742. Consequently, the voltage at input terminal 770 of signal amplifier 744 is substantially zero. Therefore, signal amplifier 744 outputs a voltage (i.e., connectivity signal 750) whose level is substantially zero, which means that the connectivity signal 750 is in the "Low" state.

Electrical circuit 740 may wholly or partly reside in storage manager 110, or it may be external to storage manager 110, as demonstrated in FIGS. 7 and 8. Pull-down resistor 742 may be replaced with a pull-up resistor, and amplifier 744 may be a logical inverter. Depending on the specifics of electrical circuit 740, storage manager 110 may interpret the "High" state of the connectivity signal 750 as a connection of storage device 100 to a programming device, as described above, or as a connection of storage device 100 to a host device, and storage manager 110 will interpret the "Low" state accordingly. By way of example, the electrical terminal providing the first signal (i.e., electrical terminal 760) resides in programmer 160. However, it can reside in host 170 device instead of programmer 160, and storage manager 110 may interpret the second signal (e.g., connectivity signal 750 or the like) accordingly.

Storage manager 110 can be a standard off-the-shelf System-on-Chip ("SoC") device or a System-in-Package ("SiP") device or general purpose processing unit with specialized software or application (e.g., application 112) that, when executed by storage manager 110, performs the configurations, steps, operations, determinations and evaluations described herein. Alternatively, storage manager 110 can be an Application-Specific Integrated Circuit ("ASIC") that implements the configurations, steps, operations, determination and evaluations described herein by using hardware.

The articles "a" and "an" are used herein to refer to one or to more than one (i.e., to at least one) of the grammatical object of the article, depending on the context. By way of example, depending on the context, "an element" can mean one element or more than one element. The term "including" is used herein to mean, and is used interchangeably with, the phrase "including but not limited to". The terms "or" and "and" are used herein to mean, and are used interchangeably with, the term "and/or," unless context clearly indicates otherwise. The term "such as" is used herein to mean, and is used interchangeably, with the phrase "such as but not limited to".

Note that the foregoing is relevant to various types of mass storage devices such as memory cards, SD-driven flash memory cards, flash storage devices, "Disk-on-Key" devices that are provided with a Universal Serial Bus ("USB") interface, USB Flash Drives ("UFDs"), MultiMedia Card ("MMC"), Secure Digital ("SD"), miniSD and microSD, and so on.

Having thus described exemplary embodiments of the invention, it will be apparent to those skilled in the art that modifications of the disclosed embodiments will be within the scope of the invention. Alternative embodiments may therefore include more modules, fewer modules and/or functionally equivalent modules. Hence the scope of the claims that follow is not limited by the disclosure herein.

What is claimed is:

1. A method comprising:
at a storage device that is embedded in a host device, wherein the storage device includes a storage manager and a plurality of memory cells, the storage device containing in a first group of the plurality of memory cells data from a programming device, performing:
reading the data from the first group of memory cells by applying a first set of reference voltages;
calculating a first number of erroneous data bits in the read data;
when the first number of erroneous data bits is larger than a threshold:
generating a second set of reference voltages by lowering at least one reference voltage of the first set of reference voltages by an amount that is determined based on the first number of erroneous data bits;
rereading the data from the first group of memory cells by applying the second set of reference voltages;
calculating a second number of erroneous data bits in the reread data; and
when the second number of erroneous data bits is less than or equal to the threshold, correcting the data based on the second set of reference voltages and writing the corrected data to a second group of the plurality of memory cells.

2. The method as in claim 1, wherein the threshold is a maximum number of erroneous data bits that can be corrected by the storage manager.

3. The method as in claim 1, wherein a determination that the storage device is embedded in the host device is based on a connectivity signal that is transferred to the storage manager.

4. The method as in claim 1, wherein the first set of reference voltages comprises one or more reference voltages determined based on a type of the storage device.

5. The method of claim 1, wherein each memory cell of the second group of memory cells is included in the first group of memory cells.

6. The method of claim 1, wherein at least one memory cell of the second group of memory cells is not included in the first group of memory cells.

7. The method of claim 1, further comprising, when the second number of erroneous data bits is greater than the threshold:
generating a third set of reference voltages by lowering at least one reference voltage of the second set of reference voltages;
rereading the data from the first group of memory cells by applying the third set of reference voltages to generate twice reread data;
calculating a third number of erroneous data bits in the twice reread data; and
when the third number of erroneous data bits is less than or equal to the threshold, writing data corrected based on the third set of reference voltages to the second group of memory cells.

8. A storage device comprising:
a memory device having a plurality of charge-storing memory cells to store data;
a storage setup module; and
a storage manager to configure the storage setup module to operate the plurality of charge-storing memory cells by applying a particular set of reference voltages;
wherein the storage manager is configured to:
determine whether the storage device is connected to a programming device;
while the storage device is connected to the programming device, receive data from the programming device and write the data into a first group of the plurality of charge-storing memory cells by application of a first set of reference voltages;
determine whether the storage device is embedded in a host device;
while the storage device is embedded in the host device:
read the data from the first group of charge-storing memory cells by application of the first set of reference voltages;
calculate a first number of erroneous data bits in the read data;
when the first number of erroneous data bits is larger than a threshold:
generate a second set of reference voltages by lowering at least one reference voltage of the first set of reference voltages by an amount that is determined based on the first number of erroneous data bits;
reread the data from the first group of charge-storing memory cells by application of the second set of reference voltages;
calculate a second number of erroneous data bits in the reread data;
when the second number of erroneous data bits is less than or equal to the threshold, correct the data based on the second set of reference voltages and write the corrected data to a second group of the plurality of charge-storing memory cells.

9. The storage device as in claim 8, further comprising:
a first electrical terminal connectable to a second electrical terminal in a first external device to receive a first signal from the first external device through the second electrical terminal; and
an electrical circuit interposed between the first electrical terminal and the storage manager to generate from the first signal a second signal,
wherein the second signal is switchable between a first logical state indicating a connection of the storage device to the first external device and a second logical state indicating a connection of the storage device to a second external device.

10. The storage device as in claim 9, wherein the first external device is the programming device and the second external device is the host device.

11. The storage device as in claim 9, wherein the electrical circuit includes a pull down resistor.

12. The storage device as in claim 9, wherein the electrical circuit resides, wholly or partly, in the storage manager.

13. The storage device as in claim 9, wherein the electrical circuit is external to the storage manager.

14. The storage device as in claim 8, wherein the storage manager is further configured to, when the second number of erroneous data bits is greater than the threshold, generate a notification to be sent to the host device, the notification indicating that the data stored in the first group of charge-storing memory cells is uncorrectable.

15. The storage device as in claim 14, wherein the storage manager is further configured to generate the notification when the data is reread a particular number of times or when at least one reference voltage in the second set of reference voltages is equal to a minimum reference voltage.

16. The storage device as in claim 8, wherein the first set of reference voltages comprises one or more reference voltages determined based on a type of the storage device.

* * * * *

UNITED STATES PATENT AND TRADEMARK OFFICE
CERTIFICATE OF CORRECTION

PATENT NO. : 8,254,170 B2
APPLICATION NO. : 12/664631
DATED : August 28, 2012
INVENTOR(S) : Yigal Eli et al.

Page 1 of 1

It is certified that error appears in the above-identified patent and that said Letters Patent is hereby corrected as shown below:

In the Claims, Column 22, Claim 8, Line 48, "the reread data;" should read --the reread data; and--.

Signed and Sealed this
Second Day of July, 2013

Teresa Stanek Rea
*Acting Director of the United States Patent and Trademark Office*